United States Patent
Long et al.

(10) Patent No.: US 11,794,607 B2
(45) Date of Patent: Oct. 24, 2023

(54) REDUNDANT POWER DISTRIBUTION CIRCUITS INCLUDING DC/DC CONVERTERS

(71) Applicant: Wisk Aero LLC, Mountain View, CA (US)

(72) Inventors: Geoffrey Alan Long, Montara, CA (US); Michael John Burgart, Los Altos, CA (US)

(73) Assignee: Wisk Aero LLC, Mountain View, CA (US)

( * ) Notice: Subject to any disclaimer, the term of this patent is extended or adjusted under 35 U.S.C. 154(b) by 130 days.

(21) Appl. No.: 17/165,565

(22) Filed: Feb. 2, 2021

(65) Prior Publication Data
US 2021/0242693 A1    Aug. 5, 2021

Related U.S. Application Data (60) Provisional application No. 62/969,232, filed on Feb. 3, 2020.

(51) Int. Cl.
*H02J 7/00* (2006.01)
*B64D 27/24* (2006.01)
(Continued)

(52) U.S. Cl.
CPC ............ *B60L 58/19* (2019.02); *B60W 10/26* (2013.01); *B64D 27/24* (2013.01); *B64D 35/02* (2013.01); *G01R 19/16542* (2013.01); *H01M 10/482* (2013.01); *H02J 1/12* (2013.01); *H02J 7/007* (2013.01); *H02J 7/0024* (2013.01); *H02J 7/0031* (2013.01); *H02J 7/0047* (2013.01); *H02M 3/04* (2013.01); *H02P 27/06* (2013.01);
(Continued)

(58) Field of Classification Search
None
See application file for complete search history.

(56) References Cited

U.S. PATENT DOCUMENTS

| 2010/0164278 A1* | 7/2010 | Oyobe | H02M 1/36 307/9.1 |
|---|---|---|---|
| 2010/0315043 A1 | 12/2010 | Chau | |

(Continued)

OTHER PUBLICATIONS

PCT/US2021/016251, "International Search Report and Written Opinion", dated Apr. 8, 2021, 10 pages.
(Continued)

*Primary Examiner* — Jared Fureman
*Assistant Examiner* — Aqeel H Bukhari
(74) *Attorney, Agent, or Firm* — Kilpatrick Townsend & Stockton LLP (57) ABSTRACT

An electrically powered vehicle includes a plurality of batteries and a plurality of DC to DC converters, each coupled to a respective battery of the plurality of batteries. Each DC to DC converter transfers power from a respective battery to a common DC bus. The common DC bus is coupled to a plurality of inverter circuits that convert the DC power to AC power. A plurality of electric motors receive power from the plurality of inverter circuits to propel the vehicle. During a regenerative event, the DC to DC converters can transfer power from the motors back to the batteries. In response to the failure of a battery, the DC to DC converters can isolate the remainder of the system from the failure.

21 Claims, 7 Drawing Sheets

(51) Int. Cl.

| | | |
|---|---|---|
| *B64D 35/02* | (2006.01) | |
| *H02P 27/06* | (2006.01) | |
| *G01R 19/165* | (2006.01) | |
| *H02M 3/04* | (2006.01) | |
| *H01M 10/48* | (2006.01) | |
| *H02J 1/12* | (2006.01) | |
| *B60L 58/19* | (2019.01) | |
| *B60W 10/26* | (2006.01) | |
| *H02M 1/00* | (2006.01) | |
| *B64U 50/19* | (2023.01) | |

(52) U.S. Cl.
CPC .......... *B64D 2221/00* (2013.01); *B64U 50/19* (2023.01); *H02M 1/0067* (2021.05)

(56) References Cited

U.S. PATENT DOCUMENTS

| | | |
|---|---|---|
| 2012/0268044 A1 | 10/2012 | Shvartsman |
| 2013/0069492 A1 | 3/2013 | Rippel et al. |
| 2017/0012445 A1* | 1/2017 | Takemura ........... H01M 10/441 |
| 2017/0057650 A1* | 3/2017 | Walter-Robinson ........................ H02J 7/0068 |
| 2017/0368956 A1 | 12/2017 | Cory et al. |
| 2019/0149724 A1 | 5/2019 | Wu et al. |
| 2020/0067400 A1* | 2/2020 | Li ....................... H02M 1/4216 |
| 2020/0115062 A1 | 4/2020 | Klonowski et al. |
| 2020/0274371 A1 | 8/2020 | Kirleis et al. |

OTHER PUBLICATIONS

PCT/US2021/016251 , "International Preliminary Report on Patentability", dated Aug. 18, 2022, 9 pages.

U.S. Appl. No. 17/165,742, "Non-Final Office Action", dated Feb. 15, 2023, 9 pages.

* cited by examiner

REDUNDANT POWER DISTRIBUTION CIRCUITS INCLUDING DC/DC CONVERTERS

CROSS-REFERENCES TO OTHER APPLICATIONS

This application is related to the following concurrently filed and commonly assigned U.S. nonprovisional patent application Ser. No. 17/165,742, for "REDUNDANT POWER DISTRIBUTION CIRCUITS FOR ELECTRIC VEHICLES" filed on Feb. 2, 2021, which is hereby incorporated by reference in its entirety for all purposes.

This application is related to the following concurrently filed and commonly assigned U.S. nonprovisional patent application TO BE FILLED IN UPON FILING, which is hereby incorporated by reference in its entirety for all purposes.

FIELD

The described embodiments relate generally to electrical circuits for rechargeable electric vehicles. More particularly, the present embodiments relate to power distribution circuits that enable regenerative charging of batteries in electrically powered vehicles.

BACKGROUND

Currently there are a wide variety of electrically powered vehicles that employ multiple batteries for storing energy that is used for propulsion. New electrical circuits are needed that enable regenerative charging of the batteries while protecting the batteries from failure events.

SUMMARY

In some embodiments a circuit comprises a plurality of batteries and a plurality of DC to DC converters, each coupled to a respective battery of the plurality of batteries. A DC bus is coupled in parallel to each of the plurality of DC to DC converters and a plurality of inverter circuits are each coupled in parallel to the DC bus. A plurality of motors are each coupled to a respective inverter circuit of the plurality of inverter circuits. In various embodiments the circuit further comprises a controller configured to monitor a voltage of the DC bus and a voltage of at least one battery of the plurality of batteries. In some embodiments the controller is configured to command at least one of the plurality of DC to DC converters to transfer power from the DC bus to at least one of the plurality of batteries based on a comparison between the voltage of the DC bus and the voltage of the at least one battery.

In some embodiments the controller is configured to command at least one of the plurality of DC to DC converters to transfer power from the DC bus to at least one of the plurality of batteries in response to at least one motor of the plurality of motors generating power during a regeneration event. In various embodiments the controller is configured to detect a failure of at least one battery of the plurality of batteries and in response, command one or more respective DC to DC converters of the plurality of DC to DC converters that are coupled to the one or more failed batteries of the plurality of batteries to isolate the one or more failed batteries from the DC bus.

In some embodiments each of the plurality of DC to DC converters includes a control circuit configured to monitor a voltage of the DC bus and to transfer power to a respective battery from the DC bus when a voltage of the DC bus is greater than a threshold voltage, wherein the threshold voltage is based on a voltage of at least one battery of the plurality of batteries. In various embodiments the control circuit is configured to transfer power from the DC bus to at least one of the plurality of batteries when at least one motor of the plurality of motors generates electrical power during a regeneration event. In some embodiments the control circuit is configured to detect a failure of at least one battery of the plurality of batteries and in response, commands the one or more respective DC to DC converters that are coupled to the one or more failed batteries of the plurality of batteries to isolate the one or more failed batteries from the DC bus. In various embodiments each of the plurality of motors is an AC motor. In some embodiments the plurality of motors propel an electrically powered vehicle. In some embodiments each of the plurality of motors is coupled to a respective propeller.

In some embodiments an electrically powered vehicle comprises a plurality of batteries and a plurality of DC to DC converters, each coupled to a respective battery of the plurality of batteries and configured to generate DC power that is coupled to a common DC bus. A plurality of inverter circuits are coupled to the common DC bus, and a plurality of electric motors are each coupled to a respective inverter circuit of the plurality of inverter circuits, wherein each motor of the plurality of electric motors propels the vehicle.

In some embodiments the electrically powered vehicle further comprises a controller configured to monitor a voltage of the common DC bus and a voltage of each battery of the plurality of batteries. In various embodiments when the voltage of the common DC bus is greater than a voltage of at least one battery of the plurality of batteries the controller commands at least one DC to DC converter of the plurality of DC to DC converters to transfer power from the common DC bus to a respective battery of the plurality of batteries. In some embodiments in response to detecting a failure of a battery of the plurality of batteries the controller commands the respective DC to DC converter of the plurality of DC to DC converters that is coupled to the failed battery to isolate the failed battery from the common DC bus.

In some embodiments each DC to DC converter of the plurality of DC to DC converters includes a control circuit configured to monitor a voltage of the common DC bus and to transfer power to a respective battery from the common DC bus when a voltage of the common DC bus is greater than a threshold voltage. In various embodiments in response to detecting a failure of a battery of the plurality of batteries the control circuit commands the respective DC to DC converter of the plurality of DC to DC converters that is coupled to the failed battery to isolate the failed battery from the common DC bus. In some embodiments each of the plurality of electric motors is an AC motor. In various embodiments each of the plurality of electric motors is coupled to a respective propeller.

In some embodiments a circuit comprises a first battery coupled to a first DC to DC converter and a second battery coupled to a second DC to DC converter. A DC bus is coupled in parallel to the first and the second DC to DC converters. A first inverter is coupled to the DC bus and a second inverter is coupled to the DC bus. A first motor is coupled to the first inverter and a second motor is coupled to the second inverter. In various embodiments the first and the second inverters are coupled in parallel to the DC bus.

In some embodiments the circuit further comprises a controller configured to monitor a voltage of the DC bus, a voltage of the first battery and a voltage of the second battery. In various embodiments in response to the voltage of the DC bus at a greater voltage than a voltage of at least one of the first and the second batteries, the controller commands the first DC to DC converter to transfer power from the DC bus to the first battery. In some embodiments in response to detecting a failure of the first battery the controller commands the first DC to DC converter to isolate the first battery from the DC bus. In various embodiments the controller is configured to command the first DC to DC converter to transfer power to the first battery when the first motor generates electrical power during a regeneration event.

In some embodiments the controller is configured to command the first DC to DC converter to transfer power to the first battery during a regeneration event. In various embodiments the controller is configured to detect a failure of the first battery and in response isolate the first battery from the DC bus. In some embodiments the first and the second motors are AC motors. In various embodiments the first and the second motors propel an electrically powered vehicle. In some embodiments each of the first and the second motors are coupled to a respective propeller.

Numerous benefits are achieved by way of the present invention over conventional techniques. For example, embodiments of the present invention provide the ability to isolate a failure in the power distribution circuit from other components and to maintain power delivery to propulsion motors during a failure. Embodiments also enable regeneration events to recharge the batteries and the individual battery circuits are isolated to prevent charge shuttling between batteries. These and other embodiments of the invention along with many of its advantages and features are described in more detail in conjunction with the text below and attached figures.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION

Techniques disclosed herein relate generally to electrical circuits for electrically powered vehicles. More specifically, techniques disclosed herein relate to power distribution circuits for electrically powered vehicles that include energy regeneration capability and redundant battery systems. Various inventive embodiments are described herein, including methods, processes, systems, devices, and the like.

In order to better appreciate the features and aspects of power distribution circuits for electrically powered vehicles according to the present disclosure, further context for the disclosure is provided in the following section by discussing one particular implementation of an electrically powered vehicle according to embodiments of the present disclosure. These embodiments are for example only and other embodiments can be employed in other electrically powered vehicles such as, but not limited to automobiles, trains, busses, motorcycles and scooters.

Figure 1:
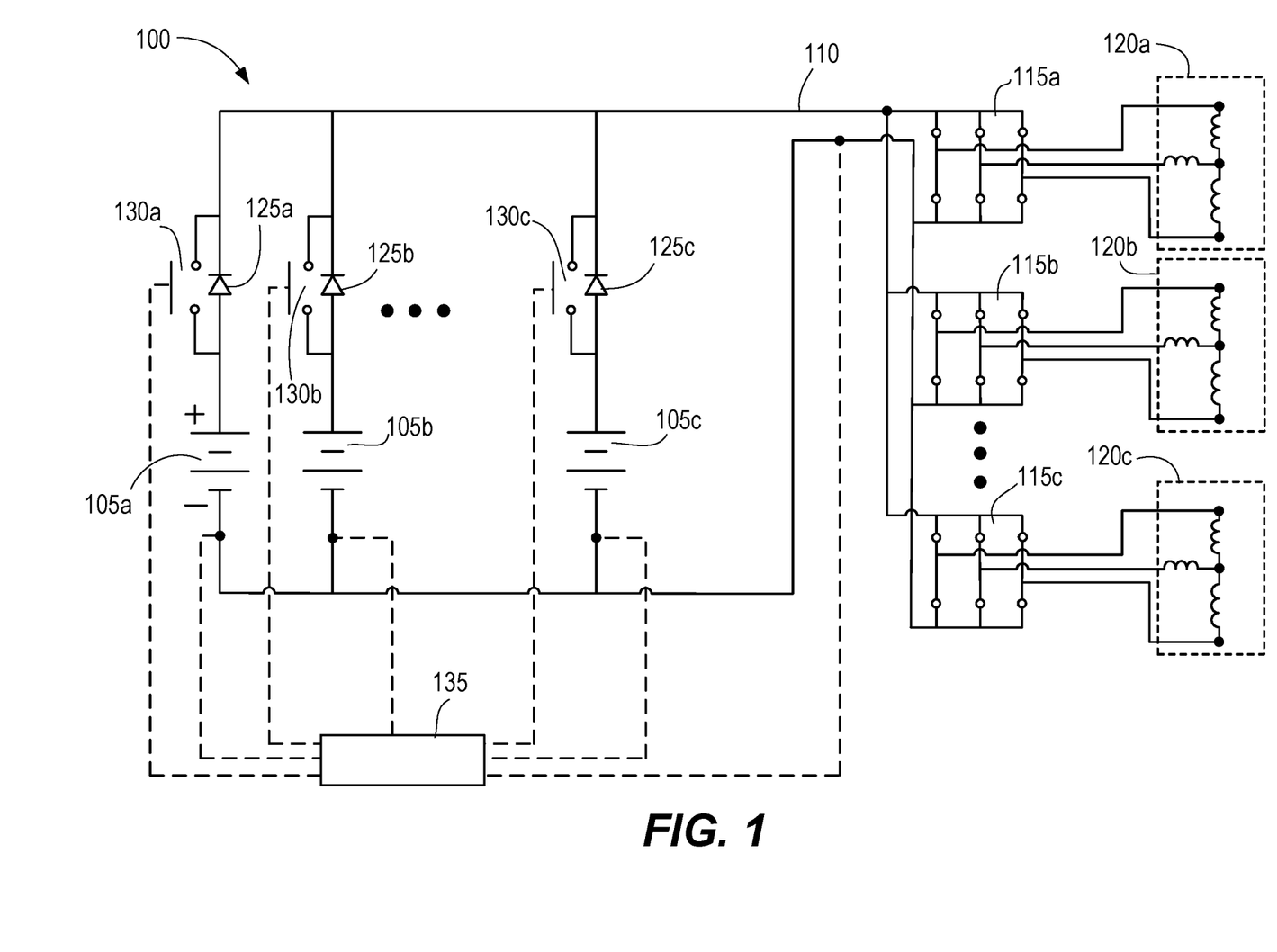
FIG. 1 depicts a schematic of a power distribution circuit including protection diodes and bypass switches, according to embodiments of the disclosure.

FIG. 1 depicts a simplified schematic of a power distribution circuit 100 for an electrically powered vehicle, according to embodiments of the disclosure. As shown in FIG. 1, power distribution circuit 100 includes a plurality of separate batteries 105a-105c that can each include a plurality of cells. In one embodiment each battery 105a-105c produces a DC voltage of approximately 600 volts, however in other embodiments the batteries can produce a different voltage. Any number of batteries can be used and some embodiments include between three and fifteen batteries.

Each battery is coupled in parallel to a common DC bus 110 that is coupled to a plurality of inverter circuits 115a-115c. Each inverter circuit 115a-115c is configured to generate a multiphase AC output that can be used to drive individual motors 120a-120c, which in one embodiment can be synchronous AC permanent magnet type motors. In some embodiments each inverter circuit 115a-115c is configured to generate a three-phase output that operates between 0 to 400 Volts AC at a frequency between 0 and 3 kHz, however one of skill in the art will appreciate that other numbers of phases, output voltages, output frequencies and types of electrical motors can be used without departing from the invention.

As further shown in FIG. 1 a diode 125a-125c is coupled in-series between each respective battery 105a-105c and DC bus 110. Diodes 125a-125c are oriented to allow batteries 105a-105c to provide current to DC bus 110 and to block current flowing from the DC bus back to the batteries. Such a configuration can be used to protect batteries 105a-105c in the case of a battery that fails in a shorted condition, which would cause the other batteries to discharge current to the failed battery. In further embodiments diodes 125a-125c can prevent charge shuttling between batteries 105a-105c that is caused by each battery having a different charge state. More specifically, in some embodiments each battery 105a-105c can have a different age and/or charge characteristic such that batteries having a relatively higher level of charge will be blocked by diodes 125a-125c from back charging batteries that have a relatively lower level of charge. Such charge shuttling can result in efficiency losses, heat generation and general system instability.

To enable batteries 105a-105c to receive regenerative power generated by motors 120a-120c, each circuit is equipped with a bypass switch 130a-130c that selectively bypasses each respective diode 125a-125c. More specifically, when engaged, each respective bypass switch 130a-130c enables power to be transferred from DC bus 110 to batteries 105a-105c so the batteries can be recharged with power generated by motors 120a-120c. In some embodiments bypass switches 130a-130c can be coupled to a controller 135 that monitors parameters of batteries 105a-105c and DC bus 110. Controller 135 can be configured to engage bypass switches 130a-130c to bypass respective diodes 125a-125c when DC bus 110 conditions (e.g., when a voltage level on the DC bus is higher than a voltage level of at least one of the batteries) indicate that a regenerative charging event is in process.

More specifically, in some embodiments motors 120a-120c are configured to act as generators such that when the motors are rotated by external mechanical forces, the motors generate electricity that travels back through inverter circuits 115a-115c and to DC bus 110. When this occurs, the voltage on DC bus 110 can increase above the voltage of batteries 105a-105c and controller 135 can detect this increase and respond by closing one or more bypass switches 130a-130c allowing current to flow from the DC bus to one or more of the batteries. When the regenerative event ends, the voltage on DC bus 110 falls below the voltage of batteries 105a-105c and controller 135 responds by opening the bypass switches. In some embodiments controller 135 only enables regenerative charging of batteries 105a-105c when a voltage of DC bus 110 is above a threshold voltage, where the threshold voltage can be set based on a maximum voltage of any one of the batteries such that charge shuttling does not occur once the bypass switches are closed. In further embodiments, controller 135 can engage only one bypass switch at a time, or a subset of the bypass switches, to recharge individual batteries, which can be used in some embodiments for example, to "top off" any battery that has a relatively low charge.

In further embodiments, one or more bypass switches 130a-130c can be engaged by an external circuit, such as when an operator specifically engages a regenerative operation, such as descending in an airplane or depressing a brake pedal, for example. In other embodiments controller 130 can have logic circuitry that can selectively engage bypass switches 130a-130c to recharge only those batteries 105a-105c that have a charge level below a particular threshold or to charge specific batteries in a predetermined sequence to preserve their lifetime. One of ordinary skill in the art having the benefit of this disclosure, would recognize many variations, modifications, and alternative techniques of when and how to engage bypass switches 130a-130c.

In some embodiments bypass switches 130a-130c are electro-mechanical relay-type switches with metallic contacts that are engaged and disengaged by an electromagnet. In other embodiments bypass switches 130a-130c are solid-state and are made from silicon, gallium-nitride, silicon-carbide or other semiconductor material.

In some embodiments controller 135 can include fault monitoring and detection circuitry such that during a regenerative operation when one or more of bypass switches 130a-130c are closed if a fault is detected (e.g., a battery fails as a short) the bypass switch for that particular battery 105a-105c is opened, preventing the other batteries from discharging current to the failed battery. One of ordinary skill, with the benefit of this disclosure, would recognize many variations, modifications, and alternatives for using the bypass switches.

In some embodiments power distribution circuit 100 of FIG. 1 may be particularly useful for aerial vehicles that need multiple separate batteries 105a-105c for redundancy purposes. In such embodiments the isolated circuits inverter and motor circuits as shown in FIG. 1 can provide additional redundancy and improved reliability. For example, the separate inverter/motor and battery circuits would provide redundancy in the case of an electrical short or failure in a DC supply line from one battery to DC bus 110, for example. In some embodiments the location of bypass switches 130a-130c may be proximate batteries 105a-105c (as shown in FIG. 1) while in other embodiments they may be proximate inverter circuits 115a-115c.

Batteries 105a-105c can be lead-acid, nickel-metal hydride, lithium-ion, lithium-ion polymer, alkaline or any other type of battery. Motors 120a-120c can be any type of AC motor including but not limited to, brush, brushless, induction, or synchronous. Inverters 115a-115c can by any type of analog or solid-state inverter circuit that converts DC power to AC power. For simplicity, various active and passive circuitry components are not shown in power distribution circuit 100.

Figure 2:
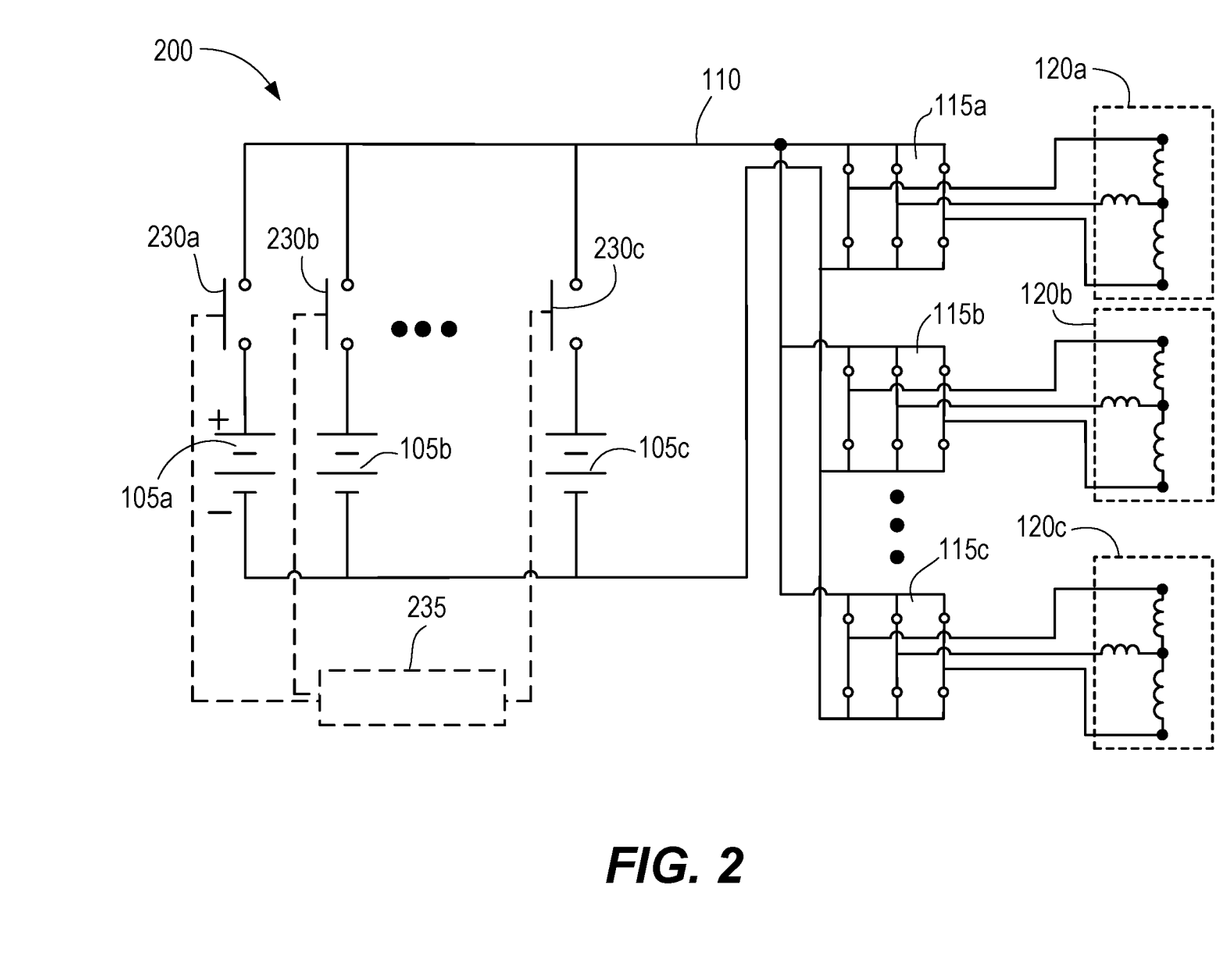
FIG. 2 depicts a schematic of a power distribution circuit including breakers, according to embodiments of the disclosure.

FIG. 2 illustrates a power distribution circuit 200 that is similar to power distribution circuit 100 shown in FIG. 1, however this embodiment does not include diodes positioned between each battery and the DC bus. Instead, as shown in FIG. 2, breakers 230a-230c are positioned between each battery 105a-105c and DC bus 110. During normal operation breakers 230a-230c are in a closed position so DC power can flow from batteries 105a-105c to DC bus 110, through inverter circuits 115a-115c and to motors 120a-120c. Controller 235 is configured to detect system faults and in response it can open one or more of breakers 230a-230c to prevent further failure, as described in more detail below.

In one example controller 235 is configured to detect the failure of a battery 105a-105c that fails in a shorted condition. Controller 235 then commands breaker 230a-230c associated with that particular battery 105a-105c to open, protecting the battery from receiving current from the other batteries coupled to DC bus 110. During such a failure, controller 235 is configured to keep the other breakers 230a-230c closed so that power can continue to be provided to motors 120a-120c. In further embodiments controller 235 is configured to only open breakers 230a-230c that are necessary and to keep all other breakers closed so power can continue to be supplied to motors 120a-120c. This operating mode can be particularly useful for aerial vehicles where continuous uninterrupted operation of motors 120a-120c is an important safety consideration.

In some embodiments breakers 230a-230c can be located proximate batteries 105a-105c (as shown in FIG. 2) while in other embodiments they can be located proximate motors 120a-120c. In further embodiments there may be a set of breakers 230a-230c proximate each battery 105a-105c and a separate set of breakers proximate each motor 120a-120c, the combination of which may be used to isolate failures in the wiring harness that extends from the batteries to the motors.

In some embodiments breakers 230a-230c are electro-mechanical type switches with metallic contacts. In other embodiments breakers 230a-230c are solid-state and are made from silicon, gallium-nitride, silicon-carbide or other semiconductor material.

Figure 3:
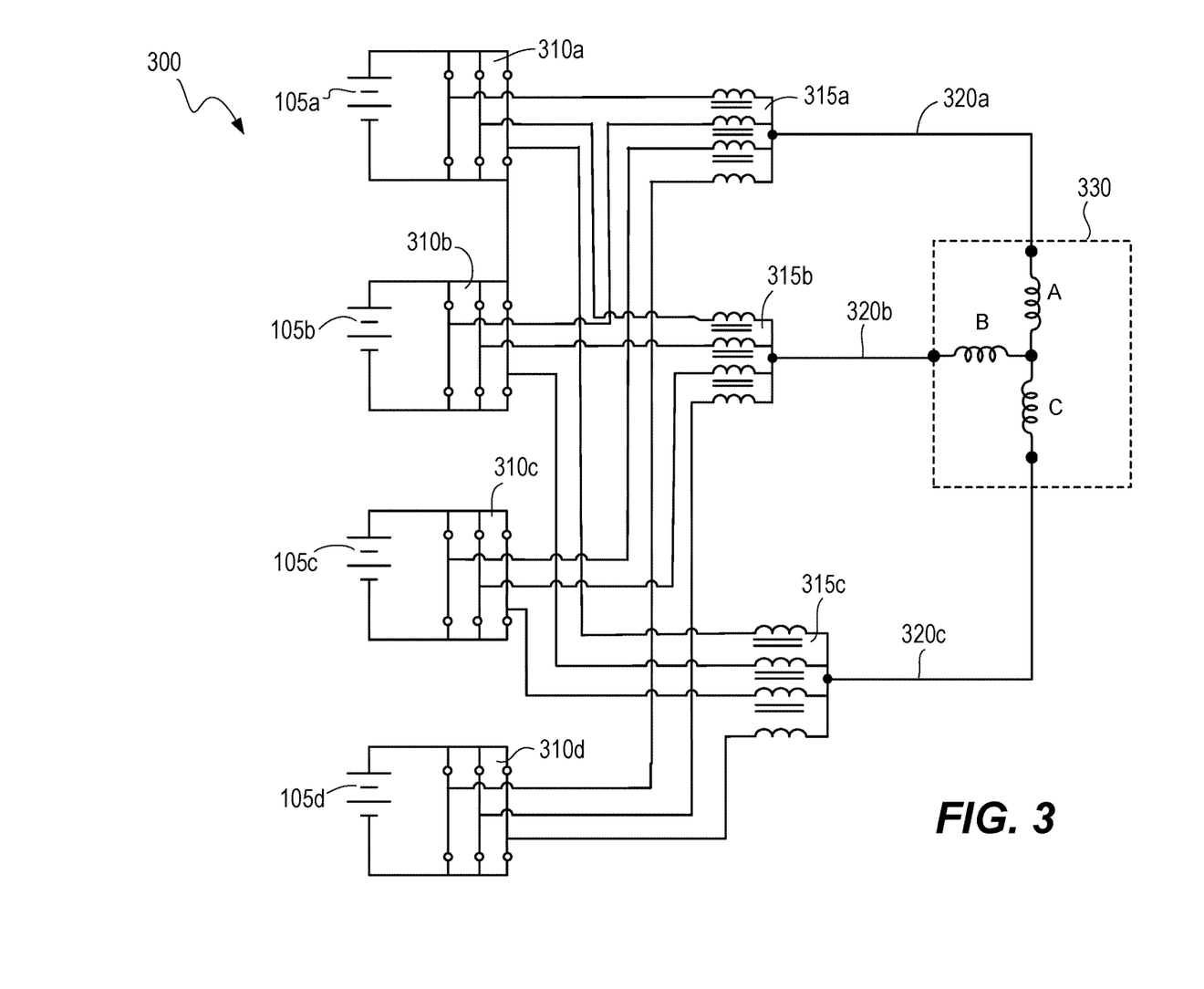
FIG. 3 depicts a schematic of a power distribution circuit including inverters and interphase transformers, according to embodiments of the disclosure.

FIG. 3 illustrates a power distribution circuit 300 according to embodiments of the disclosure. As shown in FIG. 3, each battery 105a-105d is coupled to a separate inverter 310a-310d that generates a respective three-phase AC output. There are also three separate interphase transformers 315a-315c that each receive one input phase from each inverter 310a-310d and combine those inputs into one respective drive phase 320a-320c that is coupled to a motor 330. Within each interphase transformer 315a-315c, each of the four phased inputs are electrically isolated from each other so a failure in one input does not cause a failure in any of the other three inputs. In some embodiments each interphase transformer 315a-315c is configured to inductively combine the power delivered by each of its four respective inputs to generate a unified single drive phase 320a-320c for motor 320.

Thus, each phase of motor 320 is driven by a respective interphase transformer 315a-315c that receives approximately 25 percent of its power from each of the four separate inverter/battery sets. When one battery 105a-105d or inverter 310a-310d fails, each phase of motor 330 will receive approximately 25 percent less power, but the motor will still operate. In some embodiments a master controller (not shown in FIG. 3) can be used that controls each phase of each inverter 310a-310c so the inputs to interphase transformers 315a-315c are synchronized. In some embodiments the motor controller circuit may include only inverters 310a-310d, while in other embodiments it can also include interphase transformers 315a-315c. Because of the electrical isolation between each circuit, charge shuttling between batteries 105a-105d is also not a concern.

During a regenerative event when motor 330 is turned by external mechanical forces, the motor delivers power to each interphase transformer 315a-315c which then delivers power through the separate inverters 310a-310d back to batteries 105a-105d. Each battery 105a-105d is isolated from each other battery so if one battery fails power from the other batteries cannot flow to the failed battery. Essentially each battery and each AC signal are isolated so each operates as an isolated system. As appreciated by one of skill in the art having the benefit of this disclosure the number of batteries, the number of inverters and the number of interphase transformers are not limited to that shown in FIG. 3 and other embodiments can have a different number of these devices or configuration. For example, six batteries can be used with interphase transformers that each combine six inputs. One of ordinary skill, with the benefit of this disclosure, would recognize many variations, modifications, and alternatives.

Figure 4:
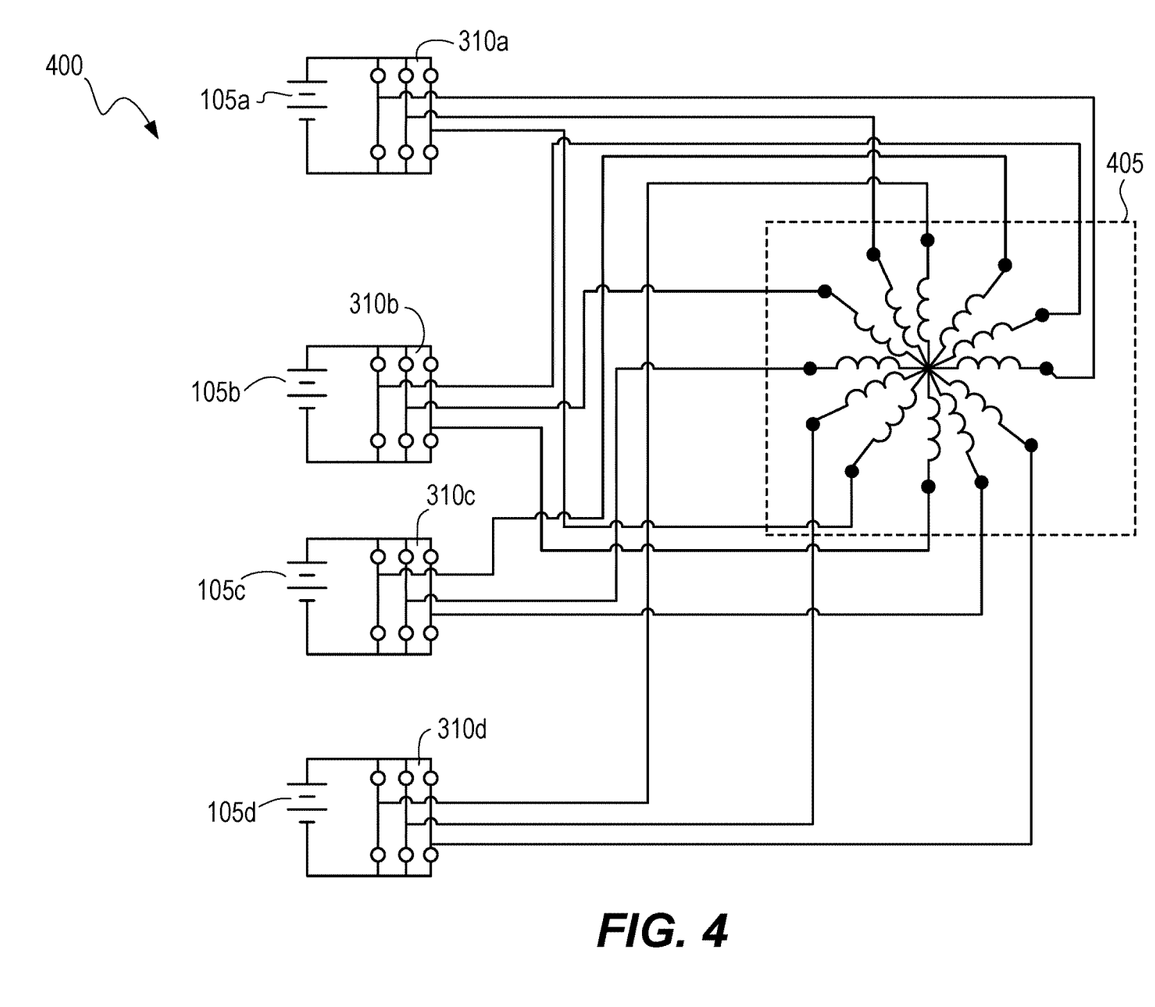
FIG. 4 depicts a schematic of a power distribution circuit including inverters and a 12-phase motor, according to embodiments of the disclosure.

FIG. 4 illustrates a power distribution circuit 400 that is similar to power distribution circuit 300 illustrated in FIG. 3, however in this embodiment there are no interphase transformers and the motor includes twelve separate windings. As shown in FIG. 4, there are four separate batteries 105a-105d, each having a separate inverter 310a-310d coupled thereto. Each inverter 310a-310d generates three separate phases with each phase being coupled directly to motor 405. Thus, with the four, three phase inverters 310a-310d there are twelve phases generated that are all individually coupled to motor 405.

In this embodiment, when one battery 105a-105d fails, three phases of the twelve phases in motor 405 will not receive power so the motor will still operate, but at only approximately 75 percent of the power. In some embodiments the circuit can include a controller configured to control the other inverters (e.g., inverters that have not failed) of the plurality of inverters to continue operation of the motor with a reduced number of phases. The controller can also control the inverter coupled to the failed battery to isolate the failed battery from the circuit. Further, each battery 105a-105d and inverter 310a-310d are electrically isolated from one another, so if a battery fails in a shorted state, current from the other batteries will not flow to the failed battery. Essentially, each battery 105a-105d and inverter 310a-310d set is electrically isolated from each other battery and inverter set. Because of the isolation, charge shuttling between batteries 105a-105d is also not a concern.

During a regeneration event, rotational energy is applied to motor 405 which operates as a generator, delivering current to each battery 105a-105d through each respective inverter 310a-310d. In other embodiments motor 405 can have any number of phases and inverters 310a-310d can generate any number of phased outputs.

Figure 5:
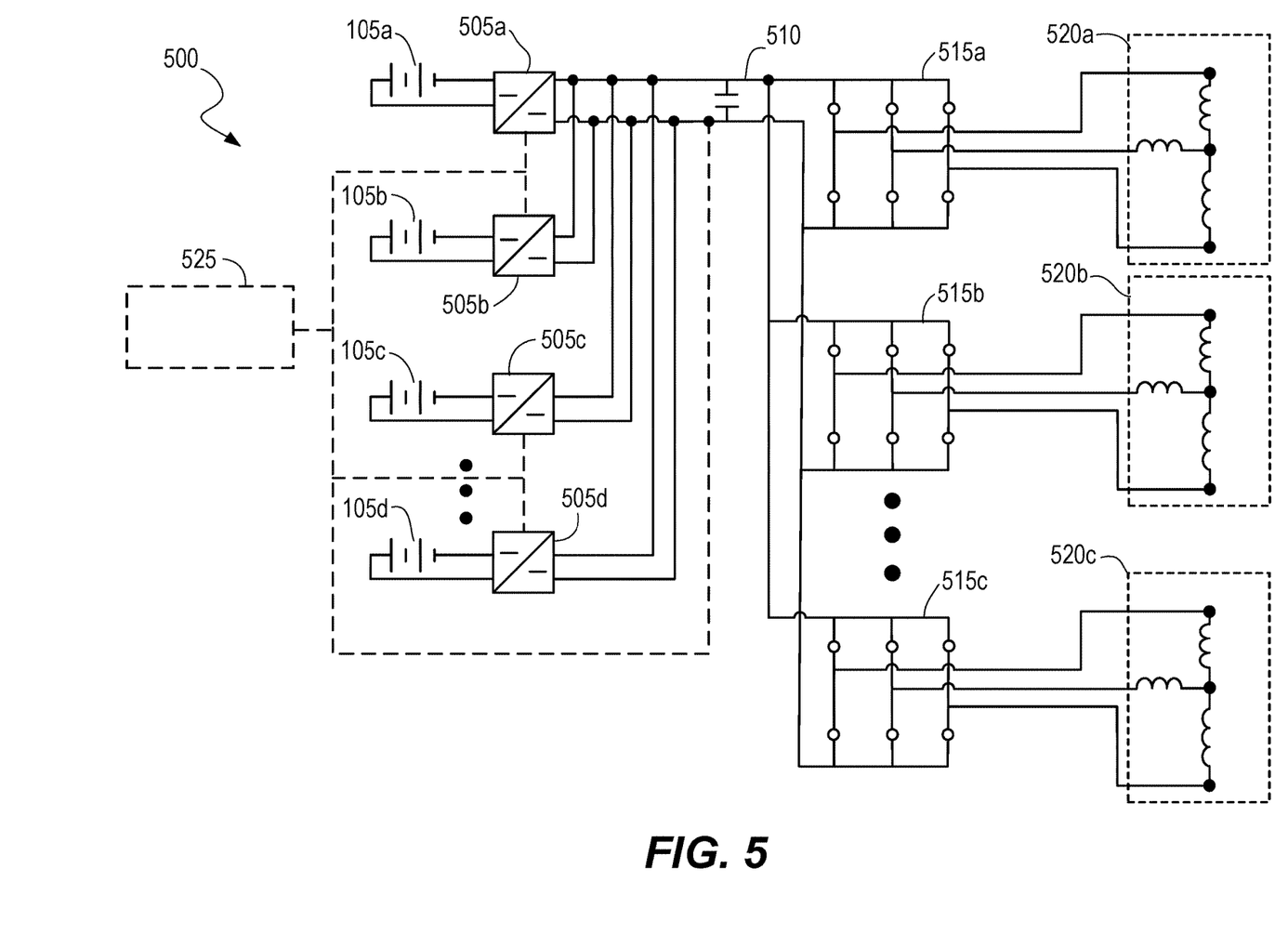
FIG. 5 depicts a schematic of a power distribution circuit including DC to DC converters coupled to inverters via a DC bus, according to embodiments of the disclosure.

FIG. 5 illustrates a power distribution circuit 500 according to embodiments of the disclosure. Power distribution circuit 500 is similar to power distribution circuits 100 and 200 illustrated in FIGS. 1 and 2, respectively, that employ a DC bus, however the embodiment illustrated in FIG. 5 uses DC/DC converters in series with each battery to supply energy to the common DC bus. As shown in FIG. 5, individual batteries 105a-105 are each coupled to separate DC/DC converters 505a-505d that convert and regulate DC energy received from each respective battery to DC energy that is coupled to a common DC bus 510. DC bus 510 is coupled in parallel to a plurality of inverters 515a-515c that each generate a three-phase AC signal that drives individual motors 520a-520c.

Each DC/DC converter 505a-505d is configured to receive power from only it's respective battery 105a-105d and deliver regulated power to DC bus 510 based on the load applied to the DC bus. More specifically, in some embodiments each DC/DC converter 505a-505d can be independently regulated and can use a voltage of DC bus 510 to control the amount of power the DC/DC converter extracts from its respective battery 105a-105d. In other embodiments a controller 525 can control each DC/DC converter 505a-505d and cycle them on and off as needed to regulate the power delivered to DC bus 510. More specifically, each DC/DC converter 505a-505d can run on a duty cycle where it is on for a given period of time and off for a given period of time.

In this embodiment, if a battery 105a-105d fails the DC/DC converter 505a-505d for that battery will not allow power to be transferred from DC bus 510 to the failed battery (e.g., if the battery fails in a shorted condition). In one example each DC/DC converter 505a-505d (or the controller 525) can monitor a voltage across each respective battery 105a-105d to detect a short or failure within the battery and in response discontinue the transfer of power from that battery to DC bus 510. In further embodiments, DC/DC converters 505a-505d can detect regenerative events and transfer power from DC bus 510 to batteries 105a-105d for recharging. In some embodiments the respective DC/DC converter 505a-505d can detect a regenerative event by monitoring a voltage potential on DC bus 510 as compared to the voltage available at the respective battery 105a-105d. In some embodiments a threshold voltage may be used to engage regenerative charging when a voltage on DC bus 510 exceeds the threshold voltage.

In some embodiments DC/DC converters 505a-505d can adjust the load sharing between each of the batteries 105a-105d to maintain each battery at a similar state of charge. In one embodiment each DC/DC converter 505a-505d monitors the respective battery 105a-105d voltage and a voltage on DC bus 510. If controller 525 senses a battery 105a-105d voltage that is relatively higher than the other battery voltages, the controller can command the respective DC/DC converter 505a-505d to draw more power from that battery to bring its charge state in line with the other batteries. In further embodiments each DC/DC converter 505a-505d can receive the same PWM (pulse-width modulation) signal from controller 525 that controls the transfer of power from each respective battery 105a-105d to DC bus 510. In some embodiments, the same PWM signal can "automatically" compensate for different charge levels in batteries 105a-105d by transferring more power from batteries having a relatively higher charge because of their higher voltage level and relatively less power from batteries having a relatively lower charge because of their lower voltage levels.

In some embodiments DC/DC converters 505a-505d can be placed proximate batteries 105a-105d while in other embodiments they can be placed proximate motors 520a-520c. In further embodiments DC bus 510 can be eliminated and each DC/DC converter 505a-505d can be coupled to a respective inverter 515a-515c and each respective inverter can be coupled to a respective motor 520a-520c as shown in FIGS. 3 and 4.

In some embodiments DC/DC converters 505a-505d can be switch-mode converters that are either isolated or non-isolated. In various embodiments isolated DC/DC converters 505a-505d may be preferable to isolate the downstream circuitry from potential failures of batteries 105a-105d. In some embodiments DC/DC converters 505a-505d can be, but are not limited to, the following architectures: step-down/buck, step-up boost, SEPIC, buck-boost or flyback. In further embodiments DC/DC converter 505a-505d can employ one or more solid-state switches that can comprise, silicon, silicon-carbide, gallium-nitride or any other type of solid-state switch.

Figure 6:
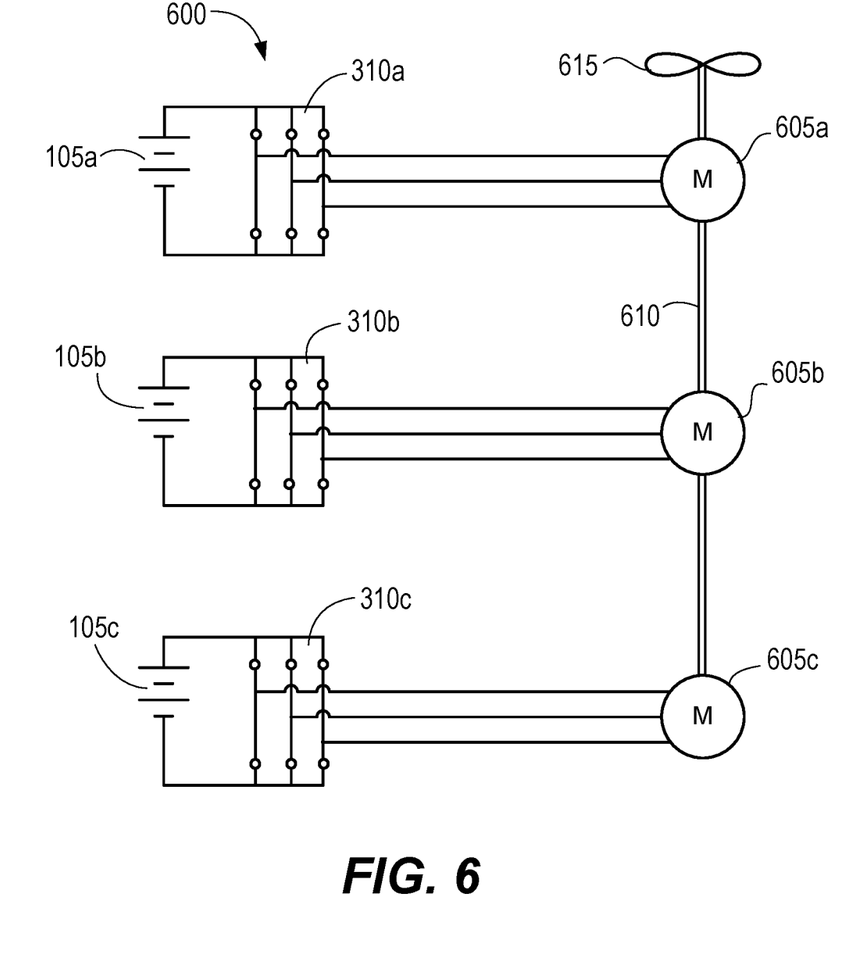
FIG. 6 depicts a schematic of a power distribution circuit including a common power shaft driven by a plurality of motors, according to embodiments of the disclosure.

FIG. 6 illustrates a power distribution circuit 600, according to embodiments of the disclosure. Power distribution circuit 600 is similar to the power distribution circuits disclosed in FIGS. 3 and 4 having one battery coupled to each inverter, however in FIG. 6 each inverter powers redundant motors that are coupled to a single shaft. As shown in FIG. 6, three individual motors 605a-605c are coupled to a single propeller shaft 610. Each of the three motors 605a-605c are driven by a separate battery 105a-105c such that if one battery fails the remaining motors and batteries are electrically isolated and can supply power to propeller shaft 610. When propeller 615 is rotated by external mechanical forces during a regenerative event, each of the individual motors 605a-605c generates electrical power that is fed back to each respective battery 105a-105c. If one battery 105a-105c or inverter 310a-310c fails, propeller 615 will still be powered by the two remaining motors 605a-605c, however with approximately 33% less power. In other embodiments fewer than three separate motors can be used per shaft and in some embodiments more than three motors can be used shaft. In yet further embodiments each motor 605a can be supplied power via a redundant power distribution system such as illustrated in FIGS. 1-3 or FIG. 5.

Figure 7:
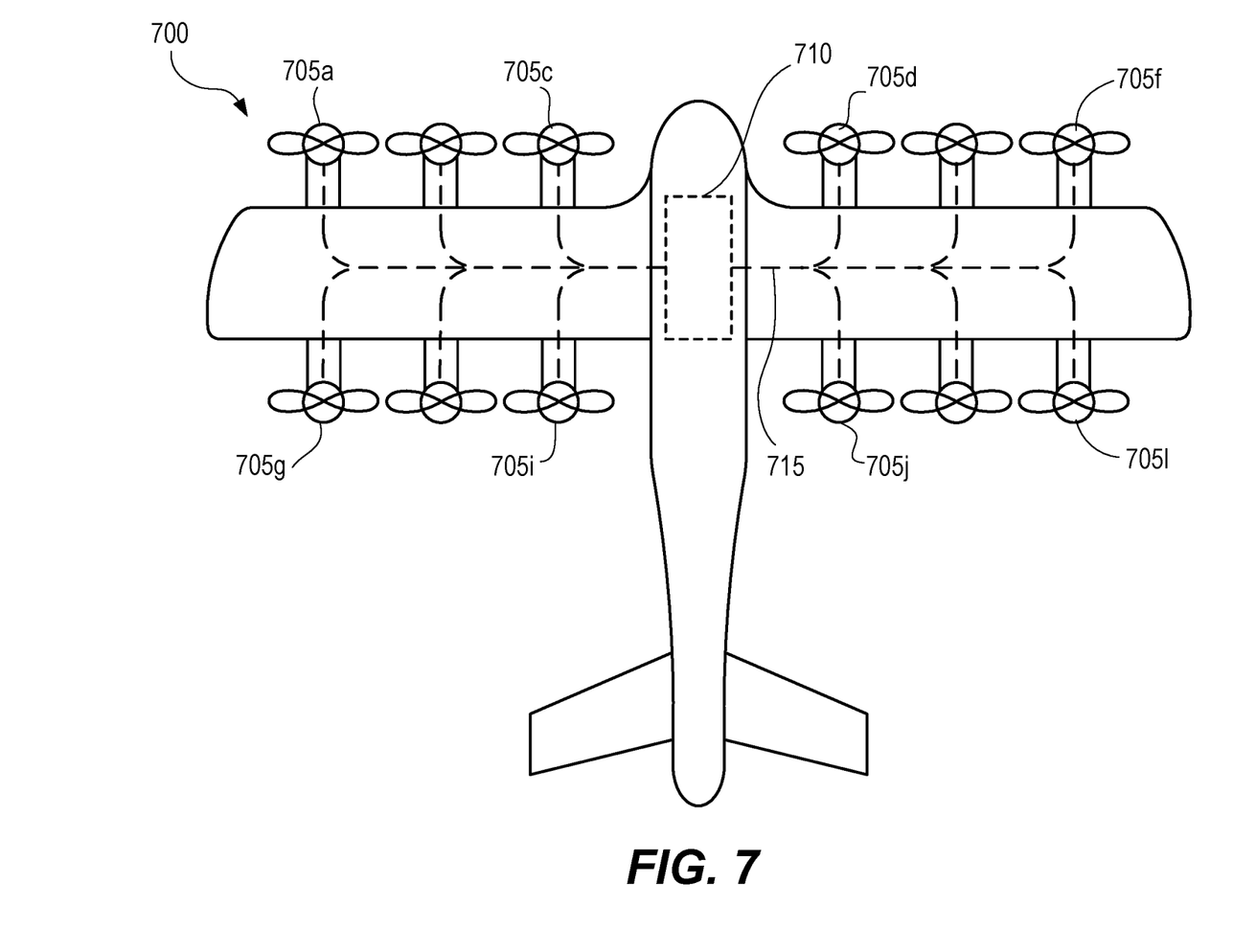
FIG. 7 depicts an electrically powered aerial vehicle including a power distribution circuit, according to embodiments of the disclosure.

FIG. 7 illustrates a simplified plan view of an aerial vehicle 700 in accordance with embodiments of the disclosure. As shown in FIG. 7, aerial vehicle 700 includes twelve motors 705a-705l that are coupled to a battery pack 710 via a harness 715. Aerial vehicle 700 can use one of or a combination of any of the power distribution circuits discussed above and illustrated in FIGS. 1-6.

Although electric vehicle 700 is described and illustrated as one particular electric vehicle, embodiments of the disclosure are suitable for use with a multiplicity of electronic vehicles. For example, any electrically powered vehicle that receives at least part of its power from one or more batteries can be used with embodiments of the disclosure. In some instances, embodiments of the disclosure are particularly well suited for use with aerial vehicles because of the reliability and failure isolation of the power delivery circuits. Although a control circuit is not illustrated in each of circuits shown in FIGS. 1-6, one or more control circuits can be added to any of the circuits described herein to control operation of the various components including, but not limited to, inverters, interphase transformers, switches, motors, feedback loops, etc.

For simplicity, various active and passive circuitry components are not shown in the figures. In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

Terms "and," "or," and "an/or," as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, B, C, AB, AC, BC, AA, AAB, ABC, AABBCCC, etc.

Reference throughout this specification to "one example," "an example," "certain examples," or "exemplary implementation" means that a particular feature, structure, or characteristic described in connection with the feature and/or example may be included in at least one feature and/or example of claimed subject matter. Thus, the appearances of the phrase "in one example," "an example," "in certain examples," "in certain implementations," or other like phrases in various places throughout this specification are not necessarily all referring to the same feature, example, and/or limitation. Furthermore, the particular features, structures, or characteristics may be combined in one or more examples and/or features.

What is claimed is:

1. An electrically powered aerial vehicle comprising:
   batteries;
   a common direct current (DC) bus;
   DC to DC converters, wherein each of the DC to DC converters is connected between an associated one of the batteries and the common DC bus and configured to transfer power between the associated one of the batteries and the common DC bus;
   motors;
   inverter circuits, wherein each of the inverter circuits is connected between an associated one of the motors and the common DC bus;
   propellers, wherein each of the propellers is configured to propel the electrically powered aerial vehicle, and wherein each of the motors is drivingly coupled to a respective one of the propellers; and
   a controller configured to control the DC to DC converters to regulate transfer of power between the batteries and the common DC bus, wherein the controller is configured to monitor each of the batteries for a failure of the battery and, in response to detecting a failure of the battery, control the associated DC to DC converter to isolate the battery from the common DC bus.

2. The electrically powered aerial vehicle of claim 1, wherein the controller is configured to monitor a voltage of each of the batteries to monitor the battery for a failure of the battery.

3. The circuit electrically powered aerial vehicle of claim 2, wherein the controller is configured to control at least one of the DC to DC converters to transfer power from the common DC bus to at least one of the batteries based on a comparison between the voltage of the common DC bus and the voltage of the at least one of the batteries.

4. The electrically powered aerial vehicle of claim 2, wherein the controller is configured to control at least one of the DC to DC converters to transfer power from the common DC bus to at least one of the batteries in response to at least one of the motors generating power during a regeneration event.

5. The electrically powered aerial vehicle of claim 1, further comprising control circuits, wherein each of the DC to DC converters is associated with one of the control circuits, wherein each of the control circuits is configured to monitor a voltage of the DC bus and to transfer power to the associated battery from the DC bus when the voltage of the DC bus is greater than a threshold voltage, wherein the threshold voltage is based on a voltage of the associated battery.

6. The electrically powered aerial vehicle of claim 5, wherein at least one of the control circuits is configured to transfer power from the DC bus to the associated battery when at least one of the motors generates electrical power during a regeneration event.

7. The electrically powered aerial vehicle of claim 1 wherein each of the motors is an AC motor.

8. An electrically powered aerial vehicle comprising:
   batteries;
   a common direct current (DC) bus;
   DC to DC converters, wherein each of the DC to DC converters is connected between an associated one of the batteries and the common DC bus and configured to transfer power between the associated one of the batteries and the common DC bus;
   electric motors;
   inverter circuits, wherein each of the inverter circuits is connected between an associated one of the electric motors and the common DC bus;
   propellers, wherein each of the propellers is configured to propel the electrically powered aerial vehicle, and wherein each of the electric motors is drivingly coupled to a respective one of the propellers; and
   a controller configured to monitor a voltage of the common DC bus and a voltage of each of the batteries and control the DC to DC converters to regulate transfer of power between the batteries and the common DC bus by the DC to DC converters based on the voltage of the common DC bus and the voltage of each of the batteries.

9. The electrically powered aerial vehicle of claim 8, wherein when the voltage of the common DC bus is greater than the voltage of at least one of the batteries the controller commands at least one of the DC to DC converters to transfer power from the common DC bus to a respective one of the batteries.

10. The electrically powered aerial vehicle of claim 8, wherein:
    the controller is configured to monitor each of the batteries for a failure of the battery; and
    in response to detecting a failure of one of the batteries, the controller controls the respective DC to DC converter of the DC to DC converters that is coupled to the failed battery to isolate the failed battery from the common DC bus.

11. The electrically powered aerial vehicle of claim 8, wherein each of the DC to DC converters includes a control circuit configured to monitor a voltage of the common DC bus and to transfer power to a respective battery from the common DC bus when a voltage of the common DC bus is greater than a threshold voltage.

12. The electrically powered aerial vehicle of claim 11, wherein, in response to detecting a failure of one of the batteries, the control circuit commands the respective DC to DC converter of the DC to DC converters that is coupled to the failed battery to isolate the failed battery from the common DC bus.

13. The electrically powered aerial vehicle of claim 8, wherein each of the electric motors is an AC motor.

14. An electrically powered aerial vehicle comprising:
    a first battery, a second battery, and a third battery;
    a common direct current (DC) bus;
    a first DC to DC converter connected between the first battery and the common DC bus and operable to transfer power from the first battery to the common DC bus and transfer power from the common DC bus to the first battery;
    a second DC to DC converter connected between the second battery and the common DC bus and operable to transfer power from the second battery to the common DC bus and transfer power from the common DC bus to the second battery;
    a third DC to DC converter connected between the third battery and the common DC bus and operable to transfer power from the third battery to the common DC bus and transfer power from the common DC bus to the third battery;
    a first propeller, a second propeller, and a third propeller, wherein each of the first propeller, the second propeller, and the third propeller is configured to propel the electrically powered aerial vehicle;
    a first electric motor drivingly coupled with the first propeller;

a second electric motor drivingly coupled with the second propeller;

a third electric motor drivingly coupled with the third propeller;

a first inverter connected between the first electric motor and the common DC bus, wherein the first inverter is operable to generate first motor drive currents from DC power received from the common DC bus and supply the first motor drive currents to the first electric motor, and wherein the first inverter is operable to generate first motor DC regeneration power from regeneration currents generated by the first electric motor and output the first motor DC regeneration power to the common DC bus;

a second inverter connected between the second electric motor and the common DC bus, wherein the second inverter is operable to generate second motor drive currents from DC power received from the common DC bus and supply the second motor drive currents to the second electric motor, and wherein the second inverter is operable to generate second motor DC regeneration power from regeneration currents generated by the second electric motor and output the second motor DC regeneration power to the common DC bus; and a third inverter connected between the third electric motor and the common DC bus, wherein the third inverter is operable to generate third motor drive currents from DC power received from the common DC bus and supply the third motor drive currents to the third electric motor, and wherein the third inverter is operable to generate third motor DC regeneration power from regeneration currents generated by the third electric motor and output the third motor DC regeneration power to the common DC bus.

15. The electrically powered aerial vehicle of claim 14 further comprising a controller configured to monitor a voltage of the common DC bus, a voltage of the first battery, a voltage of the second battery, and a voltage of the third battery, wherein the controller is configured to control the first DC to DC converter to regulate transfer of power between the first battery and the common DC bus, control the second DC to DC converter to regulate transfer of power between the second battery and the common DC bus, and control the third DC to DC converter to regulate transfer of power between the third battery and the common DC bus.

16. The electrically powered aerial vehicle of claim 15, wherein, in response to the voltage of the common DC bus being greater than the voltage of the first battery, the controller controls the first DC to DC converter to transfer power from the DC bus to the first battery.

17. The electrically powered aerial vehicle of claim 15, wherein:

the controller is configured to monitor the voltage of the first battery for a failure of the first battery; and in response to detecting a failure of the first battery, the controller controls the first DC to DC converter to isolate the first battery from the common DC bus.

18. The electrically powered aerial vehicle of claim 15, wherein the controller is configured to control the first DC to DC converter to transfer power from the common DC bus to the first battery when the first electric motor generates electrical power during a regeneration event.

19. The electrically powered aerial vehicle of claim 15, wherein the controller is configured to detect a failure of the first battery and in response isolate the first battery from the common DC bus.

20. The electrically powered aerial vehicle of claim 14, wherein each of the first electric motor, the second electric motor, and the third electric motor is an alternating current motor.

21. The electrically powered aerial vehicle of claim 14, further comprising:

a fourth battery;

a fourth DC to DC converter connected between the fourth battery and the common DC bus and operable to transfer power from the fourth battery to the common DC bus and transfer power from the common DC bus to the fourth battery;

a fourth propeller configured to propel the electrically powered aerial vehicle;

a fourth electric motor drivingly coupled with the fourth propeller; and a fourth inverter connected between the fourth electric motor and the common DC bus, wherein the fourth inverter is operable to generate fourth motor drive currents from DC power received from the common DC bus and supply the fourth motor drive currents to the fourth electric motor, and wherein the fourth inverter is operable to generate fourth motor DC regeneration power from regeneration currents generated by the fourth electric motor and output the fourth motor DC regeneration power to the common DC bus.

* * * * *